(12) United States Patent
Aritome

(10) Patent No.: US 8,154,926 B2
(45) Date of Patent: *Apr. 10, 2012

(54) MEMORY CELL PROGRAMMING

(75) Inventor: Seiichi Aritome, Hsinchu County (TW)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/695,559

(22) Filed: Jan. 28, 2010

(65) Prior Publication Data

US 2010/0128528 A1 May 27, 2010

Related U.S. Application Data

(63) Continuation of application No. 11/932,096, filed on Oct. 31, 2007, now Pat. No. 7,668,012.

(51) Int. Cl.
*G11C 16/04* (2006.01)

(52) U.S. Cl. .......... 365/185.17; 365/185.18; 365/185.12

(58) Field of Classification Search ............. 365/185.17, 365/185.18, 185.03
See application file for complete search history.

(56) References Cited

U.S. PATENT DOCUMENTS

| | | | |
|---|---|---|---|
| 6,587,372 B2 | 7/2003 | Blodgett | |
| 6,807,095 B2 | 10/2004 | Chen et al. | |
| 6,807,610 B2 | 10/2004 | Frayer | |
| 7,016,226 B2 | 3/2006 | Shibata et al. | |
| 7,095,654 B2 | 8/2006 | Quader et al. | |
| 7,352,628 B2 | 4/2008 | Kamei | |
| 7,457,178 B2 | 11/2008 | Tu et al. | |
| 7,518,923 B2 | 4/2009 | Mokhlesi | |
| 7,668,012 B2 * | 2/2010 | Aritome | 365/185.17 |
| 2005/0213393 A1 | 9/2005 | Lasser | |
| 2005/0237814 A1 | 10/2005 | Li et al. | |
| 2006/0028877 A1 | 2/2006 | Meir | |
| 2006/0209596 A1 | 9/2006 | Li | |
| 2007/0159891 A1 | 7/2007 | Tu et al. | |

OTHER PUBLICATIONS

International Search Report and Written Opinion for related PCT Application PCT/US2008/011836, dated Feb. 18, 2009 (12 pgs.).
European Search Report for related EP Application 08845348.5, mailed Apr. 18, 2011 (10 pages).
Park, Ki-Tae, et al. "A Zeroing Cell-to-Cell Interference Page Architecture with Temporary LSB Storing Program Scheme for Sub-40nm MLC NAND Flash Memories and beyond." 2007 IEEE Symposium on VLSI Circuits, IEEE, Piscataway, NJ, USA, Jun. 1, 2007, pp. 188-189.

* cited by examiner

*Primary Examiner* — Huan Hoang
(74) *Attorney, Agent, or Firm* — Brooks, Cameron & Huebsch PLLC

(57) ABSTRACT

One or more embodiments include programming, in parallel, a first cell to one of a first number of states and a second cell to one of a second number of states. Such embodiments include programming, separately, the first cell to one of a third number of states based, at least in part, on the one of the first number of states and the second cell to one of a fourth number of states based, at least in part, on the one of the second number of states.

25 Claims, 6 Drawing Sheets

PROGRAMMING SEQUENCE

| | BL0 | | BL1 | | BL2 | | BL3 | |
|---|---|---|---|---|---|---|---|---|
| ⋮ | LP | UP | LP | UP | LP | UP | LP | UP |
| WL5 | 22 | | 23 | | 22 | | 23 | |
| WL4 | 17 | △24 | 18 | ◯25 | 17 | ◇26 | 18 | ◯25 |
| WL3 | 12 | △19 | 13 | ◯20 | 12 | ◇21 | 13 | ◯20 |
| WL2 | 7 | △14 | 8 | ◯15 | 7 | ◇16 | 8 | ◯15 |
| WL1 | 2 | △9 | 3 | ◯10 | 2 | ◇11 | 3 | ◯10 |
| WL0 | 0 | △4 | 1 | ◯5 | 0 | ◇6 | 1 | ◯5 |
| | 1.5 BITS/CELL | | 2 BITS/CELL | | 2.5 BITS/CELL | | 2 BITS/CELL | |

*Fig. 4B*

MEMORY CELL PROGRAMMING

This application is a Continuation of U.S. application Ser. No. 11/932,096, filed Oct. 31, 2007, the entire specification of which is herein incorporated by reference.

TECHNICAL FIELD

The present disclosure relates generally to semiconductor memory devices and, more particularly, in one or more embodiments to memory devices having non-volatile multi-level memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix. The gates of each floating gate memory cell of the array matrix are typically coupled by rows to row select lines and their drains are coupled to column sense lines. The NOR architecture floating gate memory array is accessed by a row decoder activating a row of floating gate memory cells by selecting the row select line coupled to their gates. The row of selected memory cells then place their data values on the column sense lines by flowing different currents depending on if a particular cell is in a programmed state or an erased state.

A NAND array architecture arranges its array of floating gate memory cells in a matrix such that the gates of each floating gate memory cell of the array are coupled by rows to row select lines. However, each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on, or removed from, the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can store more than one digit, e.g., more than one binary bit. MLCs can have more than one programmed state. For instance, a cell capable of storing four bits can have sixteen different program states.

As NAND flash memory is scaled, parasitic capacitance coupling between adjacent memory cell floating gates becomes a problem. Floating gate-to-floating gate (FG-FG) interference can cause a wider threshold voltage (Vt) distribution when the distribution should be tighter. The wider distributions can result in a degraded programming performance as well as other problems.

These problems for single level cell (SLC) NAND arrays are even greater in a multiple level cell (MLC) NAND array. MLC memory stores multiple bits on each cell by using different threshold levels for each state that is stored. The difference between adjacent threshold voltage distributions may be very small as compared to an SLC memory device. Therefore, the effects of floating gate-to-floating gate coupling in an MLC device are greatly increased as the physical space between floating gates of adjacent cells decreases.

BRIEF DESCRIPTION OF THE DRAWINGS

FIG. 4B is a table which illustrates a programming operation embodiment for programming memory cells having different numbers of storable digits in accordance with the embodiment shown in FIG. 4A.

DETAILED DESCRIPTION

One or more embodiments of the present disclosure provide methods, devices, and systems for operating non-volatile multilevel memory cells. One method embodiment includes programming, in parallel, a first cell to one of a first number of states and a second cell to one of a second number of states. The method includes programming, separately, the first cell to one of a third number of states based, at least in part, on the one of the first number of states and the second cell to one of a fourth number of states based, at least in part, on the one of the second number of states.

In one or more embodiments, programming the first cell to the one of the third number of states includes programming the first cell such that it represents a first non-integer number of digits and programming the second cell to the one of the fourth number of states includes programming the second cell such that it represents a second non-integer number of digits.

In such embodiments, the second non-integer number of digits can be different than the first non-integer number of digits.

One or more embodiments can include programming a third cell to one of a fifth number of states before programming the first cell to the one of the third number of states and before programming the second cell to the one of the fourth number of states, and wherein the third cell is adjacent to and between both the first cell and the second cell. In such embodiments, the method can include programming the third cell to one of a sixth number of states based, at least in part, on the one of the fifth number of states before programming the second cell to one of the fourth number of states and after programming the first cell to the one of the third number of states.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
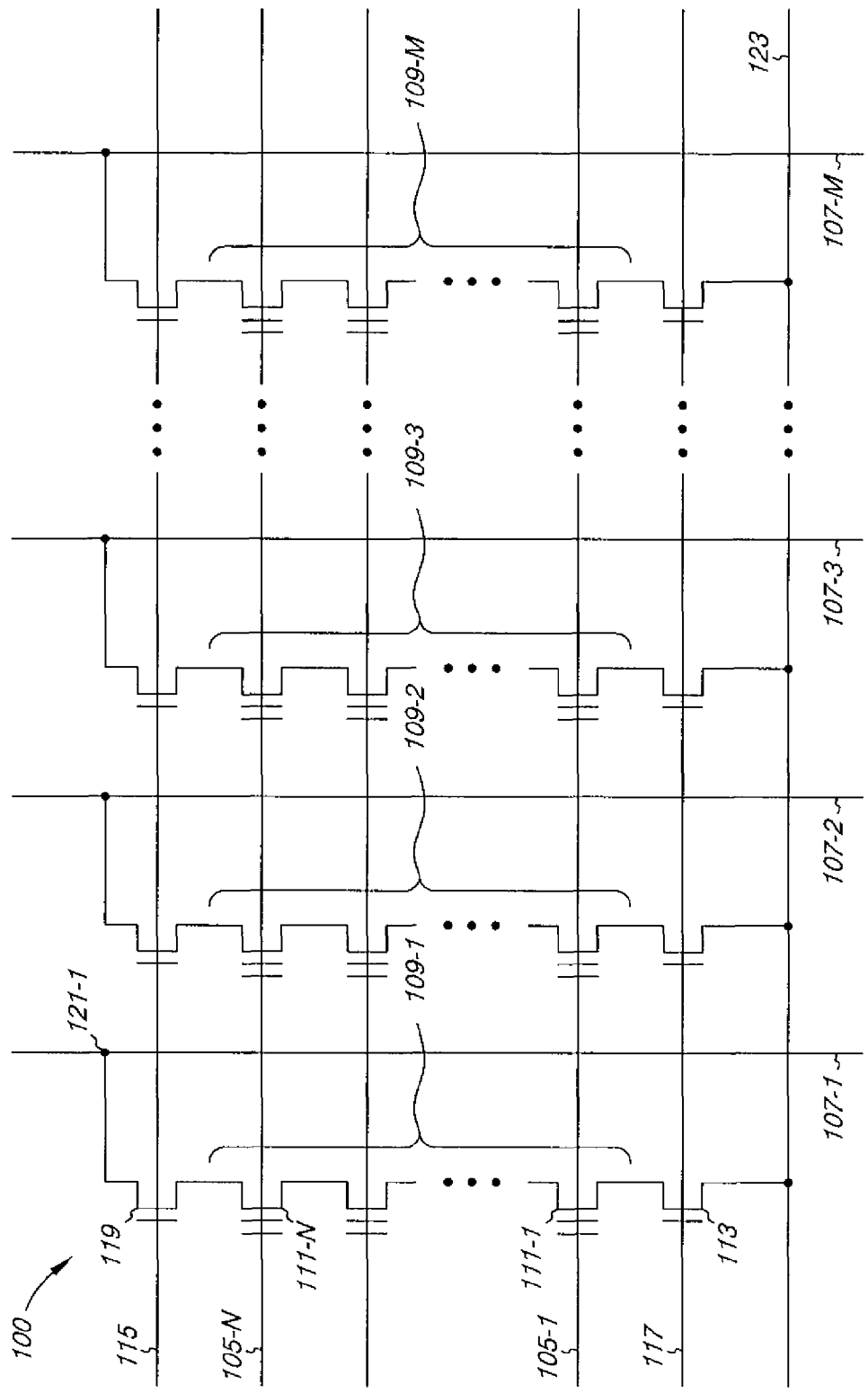
FIG. 1 is a schematic of a portion of a non-volatile memory array that can be used with embodiments of the present disclosure.

FIG. 1 is a schematic of a portion of a non-volatile memory array 100 that can be used with one or more embodiments of the present disclosure. The embodiment of FIG. 1 illustrates a NAND architecture non-volatile memory. However, embodiments described herein are not limited to this example. As shown in FIG. 1, the memory array 100 includes row select lines 105-1, ..., 105-N and intersecting column sense lines 107-1, ..., 107-M. As one of ordinary skill in the art will appreciate, row select lines 105-1, ..., 105-N can be referred to as word lines and column sense lines 107-1, ..., 107-M can be referred to as bit lines. The row select lines 105-1, ..., 105-N may be referred to herein as "select lines" and the column sense lines 107-1, ..., 107-M may be referred to herein as "sense lines." For ease of addressing in the digital environment, the number of select lines 105-1, ..., 105-N and the number of sense lines 107-1, ..., 107-M are each some power of two, e.g., 256 select lines by 4,096 sense lines.

Memory array 100 includes NAND strings 109-1, ..., 109-M. Each NAND string includes non-volatile memory cells 111-1, ..., 111-N, each located at an intersection of a select line 105-1, ..., 105-N and a local sense line 107-1, ..., 107-M. The non-volatile memory cells 111-1, ..., 111-N of each NAND string 109-1, ..., 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, ..., 111-N, includes a source, a drain, a floating gate or other charge storage layer, and a control gate. Non-volatile memory cells, 111-1, ..., 111-N, have their control gates coupled to a select line, 105-1, ..., 105-N respectively. A column of the non-volatile memory cells, 111-1, ..., 111-N, make up the NAND strings, e.g., 109-1, ..., 109-M, coupled to a given local sense line, e.g., 107-1, ..., 107-M respectively. A row of the non-volatile memory cells are commonly coupled to a given select line, e.g., 105-1, ..., 105-N. An AND array architecture would be similarly laid out except that the string of memory cells would be coupled in parallel between the select gates.

As one of ordinary skill in the art will appreciate, subsets of cells coupled to a selected select line, e.g., 105-1, ..., 105-N, can be programmed and/or read together as a group. A programming operation, e.g., a write operation, can include applying a number of program pulses, e.g., 16V-20V, to a selected row select line in order to increase the threshold voltage (Vt) of selected cells to a desired program voltage level corresponding to a desired program state. A sensing operation, such as a read or a program verify operation, can include sensing a voltage and/or current change of a sense line coupled to a selected cell in order to determine the state of the selected cell. The read and/or program verify operation can include applying a read voltage, e.g., 0V-5V, to a selected row select line, while biasing the unselected cells of the string at a voltage, e.g., 5.5V, sufficient to place the unselected cells in a conducting state independent of the threshold voltage of the unselected cells. The sense line corresponding to the selected cell being read/verified can be sensed to determine whether or not the selected cell conducts in response to the particular read voltage applied to the selected row select line.

Figures 2A, 2B:
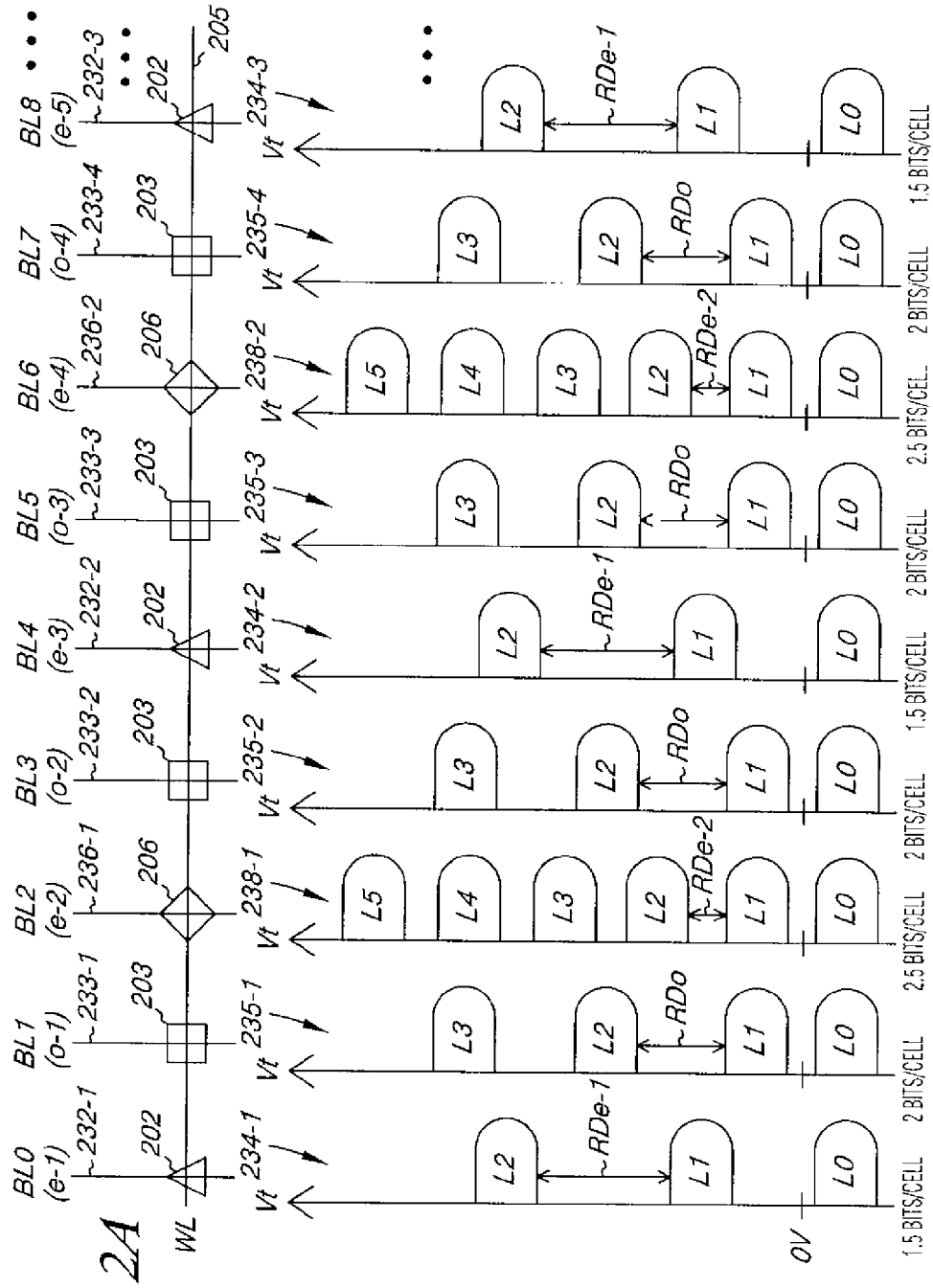
FIG. 2A illustrates a number of cells, having different numbers of storable digits, coupled to a row select line in accordance with an embodiment of the present disclosure.
FIG. 2B illustrates threshold voltage (Vt) distributions associated with the cells having different numbers of storable digits in accordance with the embodiment shown in FIG. 2A.

In various instances, the sense lines 107-1, ..., 107-M can be separated into even numbered sense lines, e.g., BL0, BL2, BL4, etc., and odd numbered sense lines, e.g., BL1, BL3, BL5, etc., as shown in FIG. 2A. In such cases, and as described further in connection with FIGS. 2A, 2B, 4A, and 4B below, cells corresponding to a selected row select line and even numbered sense lines can be programmed together and referred to as an even logical page of data. Similarly, cells corresponding to the selected row select line and odd numbered sense lines can be programmed together and referred to as an odd logical page of data. The cells coupled to alternating even numbered and odd numbered sense lines, e.g., an even page and an odd page, can be programmed and/or read at different times. For instance, even pages associated with selected row select lines can be programmed and/or read before the odd pages associated with the selected row select lines.

As one of ordinary skill in the art will appreciate, dividing select lines 105-1, ..., 105-N, e.g., physical rows, into a number of logical pages that are programmed and/or read at separate times can provide shielding among adjacent sense lines, e.g., an adjacent even and odd sense line, which can reduce sense line coupling associated with read and/or program verify operations. Adjacent sense line coupling can produce voltage noise on sense lines which can lead to inaccurate read and/or verify operations.

However, programming adjacent memory cells at different times can lead to undesirable Vt shifts due to FG-FG interference effects. For instance, the Vt level of prior programmed cells, e.g., cells coupled to even sense lines, can be shifted from their desired programmed levels due to Vt increases of subsequently programmed adjacent cells, e.g., cells coupled to odd sense lines. The Vt level shifts of programmed cells due to FG-FG interference can lead to erroneous data reads. The undesirable FG-FG interference increases due to memory device scaling. That is, the FG-FG interference effects increase as the physical proximity of adjacent cells, e.g., adjacent floating gates, decreases.

As described in connection with FIGS. 2, 4A, and 4B, various embodiments of the present disclosure can compensate for FG-FG interference effects associated with alternately programmed and/or read cells corresponding to different logical pages, e.g., even and odd logical pages, by varying the number of digits, e.g., the number of bits, stored by cells coupled to even and odd numbered sense lines. In one or more embodiments, the number of digits, e.g., the number of data bits, storable by a cell, corresponds with a number of states to which the cell can be programmed, e.g., a number of different Vt levels to which a given cell can be programmed. In some embodiments, the bit assignment, e.g., the number of digits storable by a cell, is a non-integer. That is, a particular cell can be assigned a bit value which represents a non-integer number of bits, e.g., 1.5 bits, 2.5 bits, 3.5 bits, 4.5 bits, etc.

In various embodiments in which the number of storable digits is varied, e.g., the number of bits to be stored by a cell is varied, the cells can be programmed by using a lower page and an upper page programming process. That is, in various embodiments, a two-pass programming process can be used to program cells from an erased state to a desired program state of a number of program states, e.g., to change the Vt of cells from an erase Vt level to one of a number of program Vt levels. A two-pass programming process is described in further detail below in connection with FIGS. 3, 4A, and 4B.

FIG. 2A illustrates a number of cells, having different numbers of storable digits, coupled to a row select line in accordance with an embodiment of the present disclosure. The embodiment shown in FIG. 2A illustrates a number of cells 202/203/206 coupled to a select line (WL) 205. In the embodiment shown in FIG. 2A, sense line 232-1 is a first even (e-1) numbered sense line (BL0), sense line 233-1 is a first odd (o-1) numbered sense line, sense line 236-1 is a second even (e-2) numbered sense line (BL2), sense line 233-2 is a second odd (o-2) numbered sense line (BL3), sense line 232-2 is a third even (e-3) numbered sense line (BL4), sense line 233-3 is a third odd (o-3) numbered sense line, sense line 236-2 is a fourth even (e-4) numbered sense line (BL6), sense line 233-4 is a fourth odd (o-4) numbered sense line (BL7), and sense line 232-3 is a fifth even (e-5) numbered sense line (BL8).

As shown in FIG. 2A, the cells 202 and 206 are coupled to even numbered sense lines, e.g., BL0, BL2, BL4, BL6, BL8, etc., and the cells 203 are coupled to odd numbered sense lines, e.g., BL1, BL3, BL5, BL7, etc. The cells 202 are coupled to a first subset of the even sense lines and the cells 206 are coupled to a second subset of the even bits lines on an alternate even sense line basis, e.g., the cells 202 are coupled to even numbered sense lines 232-1 (BL0), 232-2 (BL4), and 232-3 (BL8) while the cells 206 are coupled to even numbered sense lines 236-1 (BL2) and 236-2 (BL6). The pattern of cells 202/203/206 coupled to select line 205 continues on a sense line by sense line basis with a cell 203 coupled between an adjacent cell 202 and an adjacent cell 206. That is, in this embodiment, the odd sense line cells 203 are interwoven among adjacent alternating even sense line cells 202 and 206 along select line 205.

As the reader will appreciate, the sense lines can be coupled to sensing circuitry (not shown) that can be used to determine the Vt level of cells 202/203/206 during operation. Although only one select line 205 is illustrated in the embodiment of FIG. 2A, embodiments can include any number of select lines, e.g., select lines 105-1 to 105-N shown in FIG. 1. The cells coupled to select line 205 can be programmed in accordance with the programming operation embodiment shown in FIG. 4B.

In the embodiment of FIG. 2A, the cells 202 coupled to the first subset of even sense lines, e.g., 232-1, 232-2 and 232, the cells 206 coupled to the second subset of even sense lines, 236-1 and 236-2, and the cells 203 coupled to the odd sense lines, e.g., 233-1, 233-2, and 233-3, can be programmed at different times. As described further below in connection with FIGS. 4A and 4B, in some embodiments, a lower page associated with cells 202 can be programmed simultaneously with a lower page associated with cells 206. In such embodiments, an upper page associated with the cells 202 and 206 can be programmed separately.

FIG. 2B illustrates threshold voltage (Vt) distributions associated with the cells having different numbers of storable digits in accordance with the embodiment shown in FIG. 2A. The embodiment of FIG. 2B illustrates a number Vt distributions 234-1, 234-2, and 234-3 which correspond to cells 202 coupled to respective even sense lines 232-1, 232-2, and 232-3 of FIG. 2A. The Vt distributions 238-1 and 238-2 correspond to cells 306 coupled to respective even sense lines 236-1 and 236-2. The Vt distributions 235-1, 235-2, 235-3, and 235-4 correspond to cells 203 coupled to respective odd sense lines 233-1, 233-2, 233-3, and 233-4. The even sense line Vt distributions 234-1, 234-2, and 234-3 correspond to cells 202 having three program states, e.g., Vt distributions L0, L1, and L2 as shown. The even sense line Vt distributions 238-1 and 238-2 correspond to cells 206 having six program states, e.g., Vt distributions L0, L1, L2, L3, L4, and L5 as shown. The odd sense line Vt distributions 235-1, 235-2, 235-3, and 235-4 correspond to odd sense line cells 203 having four program states, e.g., Vt distributions L0, L1, L2, and L3 as shown.

That is, in the embodiment illustrated in FIGS. 2A and 2B, the even sense line cells 202 can be programmed such that the Vt of the cell 202 is within one of the three Vt distributions, e.g., program states L0, L1, and L2, associated with the distributions 234-1, 234-2, and 234-3. Similarly, the even sense line cells 206 can be programmed such that the Vt of the cell 206 is within one of the six Vt distributions L0, L1, L2, L3, L4, and L5 associated with the distributions 238-1 and 238-2. The odd sense line cells 203 can be programmed such that the Vt of the cell 203 is within one of the four Vt distributions L0, L1, L2, and L3 associated with the distributions 235-1, 235-2, 235-3, and 235-4. As the reader will appreciate, the L0 state can be referred to as an erase state or as a lowermost program state. In operation, memory cells 202, 203, and 206 can be placed in the L0 erase state prior to being programmed to one of their respective program states via a write operation.

As described further below, in various embodiments, the cells 202/203/206 coupled to a selected select line 205 are written to according to a programming operation that includes programming, in parallel, a lower page associated with cells 202 coupled to a first subset of even numbered sense lines, e.g., 232-1, 232-2, and 232-3, and a lower page associated with cells 206 coupled to a second subset of even numbered sense lines, e.g., 236-1 and 236-2. In such embodiments, the programming operation can include programming, separately, an upper page associated with the cells 202 and an upper page associated with the cells 206.

As shown in FIG. 2B, the Vt distributions 234-1, 234-2, and 234-3 correspond to even sense line cells 202 representing 1.5 bits/cell, the Vt distributions 238-1 and 238-2 correspond to even sense line cells 206 representing 2.5 bits/cell, and the Vt distributions 235-1, 235-2, 235-3, and 235-4 correspond to odd sense line cells 203 representing 2 bits/cell. That is, the number of states to which a given memory cell 202/203/206 can be programmed corresponds to a particular number of binary bits storable by the given cell. In the embodiment shown in FIGS. 2A and 2B, the even sense line cells 202 and 206 store a non-integer number of bits per cell, e.g., 1.5 bits/cell and 2.5 bits/cell, respectively, while the odd sense line cells 203 store an integer number of bits per cell, e.g., 2 bits/cell.

In some embodiments, the number of storable bits for alternate even sense line cells sum to a number of storable bits that is twice the number of storable bits for an odd sense line cell. That is, in some embodiments, the bit assignment for a cell 202 coupled to a first even (e-1) sense line, e.g., 232-1 (BL0), and the bit assignment for a cell 206 coupled to a second even (e-2) sense line, e.g., 236-1 (BL2), sum to a bit assignment that is twice the bit assignment for a cell 203 coupled to an odd sense line, e.g., 233-1 (BL1). For example, in the embodiment illustrated in FIGS. 2A and 2B, the bit assignments for an even sense line cell 202, e.g., 1.5 bits/cell, and an even sense line cell 206, e.g., 2.5 bits/cell, sum to 4 bits/cell, which is twice the bit assignment for an odd sense line cell 203, e.g., 2 bits/cell. Embodiments are not limited to the example shown in FIGS. 2A and 2B.

For instance, the cells 202/203/206 are not limited to the bit assignments shown in FIGS. 2A and 2B. As an example, in some embodiments, the cells 202 are configured to store 2.5 bits/cell, the cells 203 are configured to store 3 bits/cell, and the cells 206 are configured to store 3.5 bits/cell. In some embodiments, the cells 202 are configured to store 2 bits/cell, the cells 203 are configured to store 3 bits/cell, and the cells 206 are configured to store 4 bits/cell.

In various prior programming operations, cells coupled to even bit lines are programmed in parallel and cells coupled to odd sense lines are programmed in parallel, e.g., all odd sense line cells are programmed together as a group and all even sense line cells are programmed together as a group. In such prior approaches, the even sense line cells are assigned the same number of program states as the odd sense line cells, e.g., the even and odd sense line cells have the same assigned number of storable bits per cell. In contrast, in various embodiments of the present disclosure, the number of even and/or odd sense lines can be divided into a number of subsets. As shown in the embodiment of FIGS. 2A and 2B, the number of even sense lines BL0, BL2, BL4, etc., are divided into a first subset, e.g., 232-1, 232-2, and 232-3 coupled to cells 202 configured to store 1.5 bits/cell, and a second subset, e.g., 236-1 and 236-2 coupled to cells 206 configured to store 2.5 bits/cell. The number of odd sense lines BL1, BL3, BL5, etc. e.g., 233-1, 233-2, 233-3, and 233-4, are coupled to cells 203 configured to store 2 bits/cell. Embodiments are not limited to the number of sense lines being divided into a particular number of subsets. For example, in some embodiments the even sense lines and/or the odd sense lines can be divided into more than two subsets.

In various embodiments of the present disclosure, data stored by adjacent odd sense line cells 203 are read out together as a group, e.g., the sense lines coupled to cells 203 are sensed in parallel, and can correspond to a logical page of data, e.g., an odd logical page of data, associated with a given select line 205. In such embodiments, the first subset of even sense line cells 202 and the second subset of even sense line cells 206 can also be read out together as a group and can correspond to a logical page of data, e.g., an even logical page of data, associated with a given select line 205. In embodiments in which the first subset of even sense line cells 202 and the second subset of even sense line cells 206 are read out together, the data stored by adjacent even sense line cells, e.g., cell 202 coupled to even sense line 232-1 and cell 206 coupled to even sense line 236-1, can be combined in response to a data retrieval request received from a processor or external host associated with the array of non-volatile memory cells.

For instance, in the embodiment illustrated in FIGS. 2A and 2B, data stored by an even sense line cell 202 having a 1.5 bits/cell bit assignment can be combined with data stored by an adjacent even sense line cell 206 having a 2.5 bits/cell bit assignment such that the combined adjacent even sense line cells 202 and 206 represent 4 total logical bits, e.g., 1.5+2.5 bits, or 2 bits/cell. That is, in the embodiment of FIGS. 2A and 2B, data read from cells 202 and 206 each storing a non-integer number of bits, is combined and mapped to an integer number of binary data bits, e.g., 4 binary data bits in this example.

The embodiment illustrated in FIGS. 2A and 2B includes read margins associated with the cells 202 coupled to the first subset of even sense lines, e.g., 232-1, 232-2, and 232-3, read margins associated with the cells 206 coupled to the second subset of even sense lines, e.g., 236-1 and 236-2, and read margins associated with the cells 203 coupled to the odd sense lines, e.g., 233-1, 233-2, 233-3, and 233-4. As shown in Vt distributions 234-1, 234-2, and 234-3, the first subset of even sense lines are coupled to cells 202 having an associated read margin RDe-1 between adjacent program states L1 and L2. As shown in Vt distributions 238-1 and 238-2, the second subset of even sense lines are coupled to cells 206 having an associated read margin RDe-2 between adjacent program states L1 and L2. As shown in Vt distributions 235-1, 235-2, 235-3, and 235-4, the odd sense lines are coupled to cells 203 having an associated read margin RDo between adjacent program states L1 and L2.

In the embodiment illustrated in FIGS. 2A and 2B, read margin RDe-1 is greater than read margins RDe-2 and RDo since the first subset of even sense lines are coupled to cells 202 having a lesser assigned number of storable bits, e.g., fewer program states, than the second subset of even sense lines coupled to cells 206 and the odd sense lines coupled to cells 203. Similarly, the read margin RDo is greater than read margin RDe-2 since the odd sense line cells 203 have a lesser assigned number of storable bits than the second subset of even sense line cells 206.

As one of ordinary skill in the art will appreciate, the margin, e.g., voltage difference, between adjacent program states decreases as the number of assigned states increases since there is a finite programming window, e.g. a finite voltage range within which the Vt level of a cell can be adjusted. As the read margin, e.g., voltage difference, between adjacent program states decreases, the ability to accurately read the state of a target cell can decrease. That is, as the voltage difference between adjacent program states, e.g., program voltage levels, decreases, it can become more difficult to distinguish to which program state the cell has been programmed. This problem can be exacerbated by Vt shifts to programmed target cells due to FG-FG interference effects caused by adjacent cells programmed subsequently to the target cells being programmed to a desired state.

Floating gate-to-floating gate (FG-FG) interference associated with an array of non-volatile memory cells can be reduced by varying the number of storable bits associated with cells coupled to subsets of sense lines along a given select line as shown in the embodiment of FIGS. 2A and 2B. FG-FG interference can also be reduced by programming the lower pages and upper pages of the cells coupled to the subsets according to embodiments such as that described in connection with FIGS. 4A and 4B below.

Figure 3:
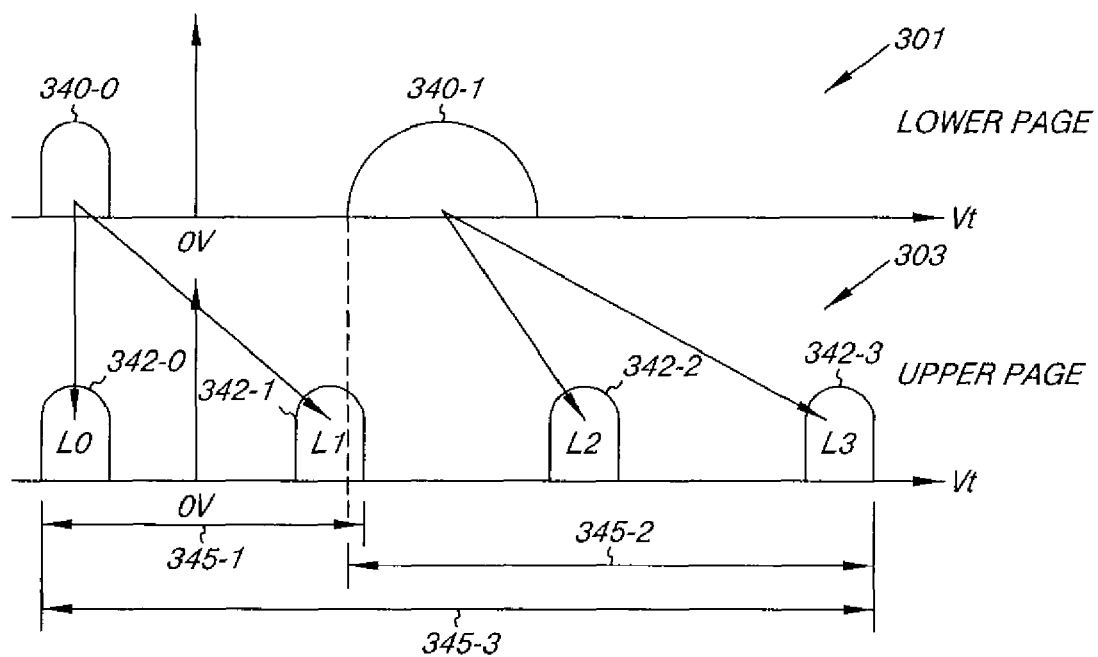
FIG. 3 illustrates a previous programming method for reducing floating gate to floating gate interference.

FIG. 3 illustrates a previous programming method for reducing floating gate to floating gate interference. As one of ordinary skill in the art will appreciate, multilevel memory cells can be programmed in multiple programming passes. Performing multiple programming passes can reduce the magnitude of Vt level shifts associated with programming cells to particular program states, which can reduce undesired Vt level shifts of previously programmed adjacent cells.

In FIG. 3, graph 301 illustrates Vt distributions 340-0 and 340-1 for cells after a first programming pass, e.g., a lower page programming process, while graph 303 illustrates the Vt distributions 342-0, 342-1, 342-1, and 342-3 after a second programming pass, e.g., an upper page programming process. The method illustrated in FIG. 3 is a two-pass programming method in which cells are programmed from an initial Vt level corresponding to an erased condition, e.g., an erase state, to a Vt level corresponding to a desired one of a number of different program levels, e.g., program states L1, L2, L3, and L4 as shown in FIG. 3.

The method shown in FIG. 3 is for non-volatile multilevel memory cells storing two bits of data per cell. As such, the cells are programmed to one of four data states, e.g., L1, L2, L3, or L4 as shown, after both the lower page and upper page programming process have been performed. However, embodiments of the present disclosure are not limited to MLCs storing 2 bits per cell, e.g., in some embodiments the MLCs may store more or fewer than 2 bits per cell and may store a non-integer number of bits per cell.

In the method shown in FIG. 3, programming the lower page of a cell, e.g., the first programming pass, involves programming cells from a Vt level corresponding to an erase state to a Vt level within one of the Vt distributions 340-0 and 340-1. The Vt distributions 340-0 and 340-1 represent a first number of states to which a cell can be programmed from the erase state during the lower page programming process. Programming the upper page of a cell, e.g., the subsequently performed second programming pass, involves programming cells from a Vt level within one of the distributions 340-0 and 340-1 to a Vt level within one of the Vt distributions 342-0 (L0), 342-1 (L1), 342-3 (L3), and 342-4 (L4). That is, the Vt distributions 342-0 (L0), 342-1 (L1), 342-3 (L3), and 342-4 (L4) represent a second number of states to which a cell can be programmed from one of the first number of states, e.g., distributions 340-1 and 340-2, during the upper page programming process.

As shown in FIG. 3, cells to be programmed to state L0 and cells to be programmed to state L1 are programmed to distribution 340-0 during lower page programming, and cells programmed to state L2 and L3 are programmed to distribution 340-1 during lower page programming. That is, the particular one of the first number of states, e.g., 340-0 and 340-1, to which a cell is programmed during lower page programming is based on the particular one of the second number of states, e.g., program states L0, L1, L2, and L3, to which the cell is to be programmed during the upper page programming process. The programming method of FIG. 3 results in a Vt shift amount 345-1 associated with programming a cell from distribution 340-0 to distribution 342-0 (L0) or 342-1 (L1) and results in a Vt shift amount 345-2 associated with programming a cell from distribution 340-1 to distribution 342-2 (L2) or 342-3 (L3).

FIG. 3 also illustrates a Vt shift amount 345-3 corresponding to what the maximum Vt shift amount of a cell would be if programmed according to a different method in which the cell were programmed from distribution 340-0, e.g., an erase state, to the uppermost program state L3, e.g., 343-3. Reducing the Vt shift amount associated with programming a cell can decrease undesirable FG-FG interference effects, e.g., Vt level shifts, experienced by previously programmed adjacent cells, e.g., adjacent cells previously programmed to a final program state such as L1, L2, L3, or L4. Memory cells programmed to a final program state refers to cells having undergone a lower page and an upper page programming process, e.g., cells that are not to receive further programming pulses.

Figure 4A:
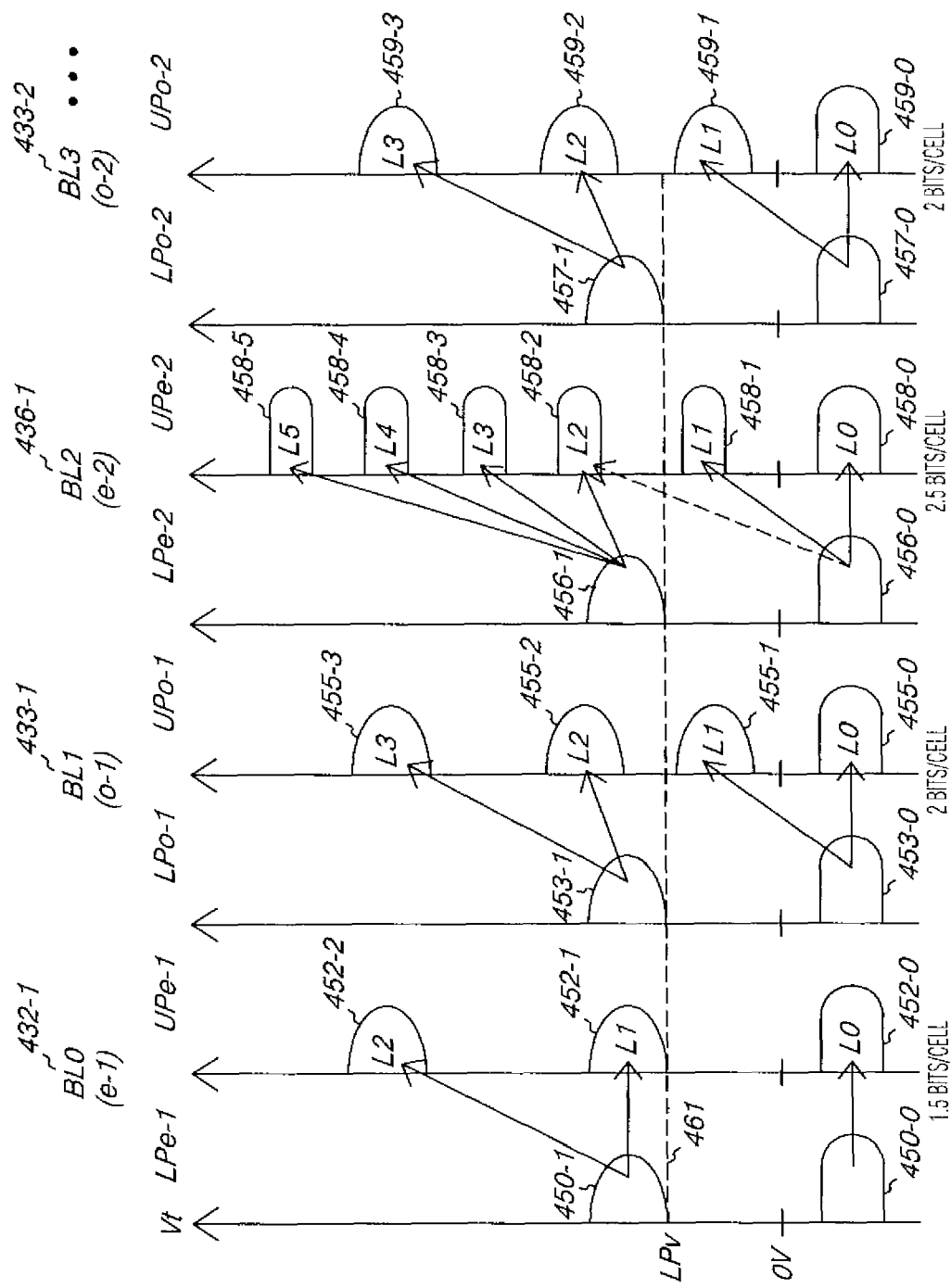
FIG. 4A illustrates a two-pass programming method associated with programming memory cells having different numbers of storable digits in accordance with an embodiment of the present disclosure.

FIG. 4A illustrates a two-pass programming method associated with programming memory cells having different numbers of storable digits in accordance with an embodiment of the present disclosure. The embodiment illustrated in FIG. 4A includes Vt distributions associated with cells coupled to a first even (e-1) numbered sense line 432-1 (BL0), cells coupled to a first odd (o-1) numbered sense line 433-1 (BL1), cells coupled to a second even (e-2) numbered sense line 436-1 (BL2), and cells coupled to a second odd (o-2) numbered sense line 433-2 (BL3). The Vt distributions associated with the four sense lines BL0, BL1, 13L2, and BL3 illustrated in FIG. 4A can continue in the sense line direction such that Vt distributions associated with cells coupled to a fifth sense line match the Vt distributions associated with the first even numbered sense line 432-1 (BL0), Vt distributions associated with cells coupled to a sixth sense line match the Vt distributions associated with the first odd numbered sense line 433-1 (BL1), Vt distributions associated with cells coupled to a seventh sense line match the Vt distributions associated with the second even numbered sense line 436-1 (BL2), Vt distributions associated with cells coupled to an eighth sense line match the Vt distributions associated with the second odd numbered sense line 433-2 (BL3), etc.

FIG. 4A illustrates Vt distributions of the memory cells coupled to sense lines 432-1, 433-1, 436-1, and 433-2 after a first lower page (LP) programming process and after an upper page (UP) programming process. That is, the memory cells are programmed according to a two-pass programming method, e.g., a first pass in which a cell is programmed to one of a first number of states and a subsequent pass in which the cell is programmed to one of a second number of states.

In the embodiment illustrated in FIG. 4A, cells coupled to sense line 432-1 are configured to store 1.5 bits/cell, which corresponds to three program states L0, L1, and L3, the cells coupled to sense lines 433-1 and 433-2 are configured to store 2 bits/cell, which corresponds to four program states L0, L1, L2, and L3, and the cells coupled to sense line 436-1 is configured to store 2.5 bits/cell, which corresponds to six program states L0, L1, L2, L3, L4, and L5. However, embodiments are not limited to a particular number of storable digits, e.g., storable bits, and/or number of program states for memory cells coupled to particular sense lines.

In the lower page programming process LPe-1 associated with the first even sense line 432-1, cells coupled to the first even sense line 432-1 and coupled to a selected row select line are programmed to one of the lower page Vt distributions 450-0 and 450-1. As indicated by arrows, first even sense line 432-1 cells to be subsequently programmed to upper page Vt distribution 452-0 (L0) are programmed to lower page Vt distribution 450-0. First even sense line 432-1 cells to be subsequently programmed to upper page Vt distribution 452-1 (L1) or 452-2 (L2) are programmed to lower page Vt distribution 450-1.

In the lower page programming process LPo-1 associated with the first odd sense line 433-1, cells coupled to the first odd sense line 433-1 and coupled to the selected row select line are programmed to one of the lower page Vt distributions 453-0 and 453-1. As indicated by arrows, first odd sense line 433-1 cells to be subsequently programmed to upper page Vt distribution 455-0 (L0) or 455-1 (L1) are programmed to lower page Vt distribution 453-0. First odd sense line 433-1 cells to be subsequently programmed to upper page Vt distribution 455-2 (L2) or 455-3 (L3) are programmed to lower page Vt distribution 453-1.

In the lower page programming process LPe-2 associated with the second even sense line 436-1, cells coupled to the second even sense line 436-1 and coupled to the selected select line are programmed to one of the lower page Vt distributions 456-0 and 456-1. As indicated by arrows, second even sense line 436-1 cells to be subsequently programmed to upper page Vt distribution 458-0 (L0) or 458-1 (L1) are programmed to lower page Vt distribution 456-0. Second even sense line 436-1 cells to be subsequently programmed to upper page Vt distribution 458-2 (L2), 458-3 (L3), 458-4 (L4), or 458-5 (L5) are programmed to lower page Vt distribution 456-1. As indicated by the dashed arrow, in some embodiments, second even sense line 436-1 cells to be subsequently programmed to upper page Vt distribution 458-2 (L2) can be programmed to lower page Vt distribution 456-0, e.g., cells to be programmed to 458-2 (L2) during upper page programming can be programmed to either lower page Vt distribution 456-0 or 456-1 during lower page programming.

In the lower page programming process LPo-2 associated with the second odd sense line 432-2, cells coupled to the second odd sense line 432-2 and coupled to the selected select line are programmed to one of the lower page Vt distributions 457-0 and 457-1. As indicated by arrows, second odd sense line 433-2 cells to be subsequently programmed to upper page Vt distribution 459-0 (L0) or 459-1 (L1) are programmed to lower page Vt distribution 457-0. Second odd sense line 433-2 cells to be subsequently programmed to upper page Vt distribution 459-2 (L2) or 459-3 (L3) are programmed to lower page Vt distribution 457-1.

In various embodiments, and as shown in FIG. 4A, a lower page verify voltage (LPv) level 461 is shared by cells having different numbers of storable bits and coupled to different sense lines. That is, the program verify voltage level, e.g., LPv level 461, corresponding to the lower page Vt distributions 450-1, 453-1, 456-1, and 457-1 can be aligned. For example, the verify voltage level 461 associated with lower page Vt distributions 450-1, 453-1, 456-1, and 457-1 is shared by cells coupled to respective sense lines 432-1, 433-1, 436-1, and 433-2 and coupled to a selected select line, e.g., select line 205 shown in FIG. 2A.

In the upper page programming process UPe-1 associated with the first even sense line 432-1, cells coupled to the first even sense line 432-1 and coupled to a selected select line are programmed to one of the upper page Vt distributions 452-0, 452-1, and 452-2. In the upper page programming process UPo-1 associated with the first odd sense line 433-1, cells coupled to the first odd sense line 433-1 and coupled to the selected select line are programmed to one of the upper page Vt distributions 455-0, 455-1, 455-2, and 455-3. In the upper page programming process UPe-2 associated with the second even sense line 436-1, cells coupled to the second even sense line 436-1 and coupled to the selected select line are programmed to one of the upper page Vt distributions 458-0, 458-1, 458-2, 458-3, 458-4, and 458-5. In the upper page programming process UPo-2 associated with the second odd sense line 432-2, cells coupled to the second odd sense line 432-2 and coupled to the selected select line are programmed to one of the upper page Vt distributions 459-0, 439-1, 459-2, and 459-3.

FIG. 4B is a table which illustrates a programming operation embodiment for programming memory cells having different numbers of storable digits in accordance with the embodiment shown in FIG. 4A. As described in connection with FIG. 4A, cells coupled to a first even sense line 432-1 (BL0) are configured to store a first number of storable bits, e.g., a 1.5 bits/cell in this embodiment. Cells coupled to a first odd sense line 433-1 (BL1) are configured to store a second number of storable bits, e.g., a 2 bits/cell in this embodiment. Cells coupled to a second even sense line 436-1 (BL2) are configured to store a third number of storable bits, e.g., a 2.5 bits/cell in this embodiment. Cells coupled to a second odd sense line 433-2 (BL3) have the same number of storable bits as the first odd sense line 433-1 (BL1), e.g., 2 bits/cell in this embodiment.

As noted above, the number of storable digits associated with the sense lines shown in FIGS. 4A and 4B, e.g., sense lines 432-1, 433-1, 436-1, and 432-2, can be repeated for subsequent sense lines in the sense line direction. For instance, as shown above in the embodiment of FIGS. 2A and 2B, the next four sense lines, e.g., BL4, BL5, BL6, and BL7 shown in FIG. 2A, can have analogous numbers of storable digits as sense lines BL0, BL1, BL2, and BL3, respectively.

As described above in connection with FIGS. 2A and 2B, in various embodiments, the first even numbered sense line 432-1 (BL0) represents a first subset of even sense lines, e.g., a subset of even sense lines coupled to cells storing 1.5 bits/cell, and the second even numbered sense line 436-1 (BL2) represents a second subset of even sense lines, e.g., a subset of even sense lines coupled to cells storing 2.5 bits/cell. In such embodiments, and as shown in FIG. 4B, the first subset of even numbered sense lines, e.g., 432-1, and the second subset of even numbered sense lines, e.g., 436-1, can be alternated on an every other even sense line basis. That is, a cell coupled to a next even numbered sense line, e.g., BL4 (not shown), would have the same number of storable digits as a cell coupled to BL0, e.g., 1.5 bits/cell in this example, while a cell coupled to a next subsequent even numbered sense line, e.g., BL6 (not shown), would have the same number of storable digits as a cell coupled to BL2, e.g., 2.5 bits/cell in this example.

In the embodiment of FIG. 4B, each of the non-volatile multilevel memory cells to be programmed has an associated lower page (LP as shown) and an associated upper page (UP as shown). That is, each cell coupled to a particular select line, e.g., WL0, WL1, WL2, WL3, WL4, and WL5 as shown, and coupled to a particular sense line, e.g., 432-1, 433-1, 436-1, and 433-2, is programmed via a lower page/upper page programming process such as that shown in FIG. 4A. As used herein, programming a lower page of a cell(s) refers to performing a lower page programming process on the cell(s), and programming an upper page of a cell(s) refers to performing an upper page programming process on the cell(s). In the table 400, the triangles 452 represent the upper pages of cells coupled to a first even numbered sense line, e.g., 432-1 (BL0), the diamonds 456 represent the upper pages of cells coupled to a second even numbered sense line, e.g., 436-1 (BL2), and the circles 453 represent cells coupled to odd numbered sense lines, e.g., 433-1 (BL1) and 433-2 (BL3).

In the embodiment illustrated in FIG. 4B, the order of programming follows an increasing numerical sequence beginning with "0." An identical numerical identifier indicates parallel programming, e.g., programming which occurs at substantially the same time. For example, in table 400, the identifier "1" indicates that the lower page (LP) of the memory cell coupled to WL0 and sense line 433-1 and the lower page (LP) coupled to WL0 and sense line 433-2 are programmed in parallel, e.g., at the same time.

In various embodiments, programming is started from the bottom of the array with a select line that is adjacent to the source line of a particular block of non-volatile memory cells. In the embodiment illustrated in FIG. 4B, programming is started from select line WL0, which can be adjacent to the source line of the array, e.g., array 100 shown in FIG. 1.

The table 400 shown in FIG. 4B illustrates a programming order of the lower page (LP) and the upper page (UP) associated with memory cells to be programmed. As shown in the programming operation embodiment of FIG. 4B, and as indicated by "0," the programming operation begins with programming, in parallel, the lower page associated with a WL0 cell coupled to the first even sense line 432-1 (BL0) and the lower page associated with a WL0 cell coupled to the second even sense line 436-1 (BL2). In various embodiments, and as shown in FIG. 4A, the WL0 cell coupled to even sense line 432-1 (BL0) is configured to store a lesser number of bits/cell, e.g., 1.5 bits/cell, than the number of bits/cell, e.g., 2.5 bits/cell, which the WL0 cell coupled to even sense line 436-1 (BL2) is configured to store.

The programming operation continues, e.g., as indicated by "1," with programming, in parallel, the lower page associated with a WL0 cell coupled to the first odd sense line 433-1 (BL1) and the lower page associated with a WL0 cell coupled to the second odd sense line 433-2 (BL3). In various embodiments, and as shown in FIG. 4B, the WL0 cells coupled to odd sense lines 433-1 (BL1) and 433-2 (BL3) are configured to store a lesser number of bits/cell, e.g., 2 bits/cell, than the number of bits/cell, e.g., 2.5 bits/cell, which the WL0 cell coupled to even sense line 436-1 (BL2) is configured to store. In such embodiments, and as shown in FIG. 4B, the WL0 cells coupled to odd sense lines 433-1 (BL1) and 433-2 (BL3) are configured to store a greater number of bits/cell, e.g., 2 bits/cell, than the number of bits/cell, e.g., 1.5 bits/cell, which the WL0 cell coupled to even sense line 432-1 (BL0) is configured to store.

The programming operation continues, e.g., as indicated by "2," with programming, in parallel, the lower page associated with a WL1 cell coupled to the first even sense line 432-1 (BL0) and the lower page associated with a WL1 cell coupled to the second even sense line 436-1 (BL2). The programming operation continues, e.g., as indicated by "3," with programming, in parallel, the lower page associated with a WL1 cell coupled to the first odd sense line 433-1 (BL1) and the lower page associated with a WL1 cell coupled to the second odd sense line 433-2 (BL3).

The programming operation continues, e.g., as indicated by "4," with programming the upper page 452 of the WL0 cell coupled to the first even sense line 432-1 (BL0). As indicated by "5," the operation continues with programming, in parallel, the upper page 453 of the WL0 cells coupled to the first and second odd sense lines 433-1 (BL1) and 433-2 (BL3). As indicated by "6," the operation continues with programming the upper page 456 of the WL0 cells coupled to the second even sense line 436-1 (BL2). That is, in the embodiment of FIG. 4B, the upper page 452 of the WL0 cell coupled to the first even sense line 432-1 (BL0) and the upper page 456 of the WL0 cell coupled to the second even sense line 436-1 are programmed separately, e.g., upper page 452 is programmed prior to upper page 456. Programming, separately, the upper pages 452 and 456 of cells coupled to alternate even numbered sense lines 432-1 and 436-1, and programming, in parallel, the lower pages of the cells coupled to the sense lines 432-1 and 436-1 can reduce FG-FG interference associated with adjacent cells, e.g., cells coupled to adjacent odd numbered sense lines 433-1 and 433-2 and/or adjacent cells coupled to an adjacent select line.

As indicated by "7," the programming operation continues with programming, in parallel, the lower page associated with a WL2 cell coupled to the first even sense line 432-1 (BL0) and the lower page associated with a WL2 cell coupled to the second even sense line 436-1 (BL2). The programming operation continues, e.g., as indicated by "8," with programming, in parallel, the lower page associated with a WL2 cell coupled to the first odd sense line 433-1 (BL1) and the lower page associated with a WL2 cell coupled to the second odd sense line 433-2 (BL3).

The programming operation continues, e.g., as indicated by "9," with programming the upper page 452 of the WL1 cell coupled to the first even sense line 432-1 (BL0). As indicated by "10," the operation continues with programming, in parallel, the upper page 453 of the WL1 cells coupled to the first and second odd sense lines 433-1 (BL1) and 433-2 (BL3). As indicated by "11," the operation continues with programming the upper page 456 of the WL1 cells coupled to the second even sense line 436-1 (BL2). That is, in the embodiment of FIG. 4B, the upper page 452 of the WL1 cell coupled to the first even sense line 432-1 (BL0) and the upper page 456 of the WL1 cell coupled to the second even sense line 436-1 are programmed separately, e.g., upper page 452 is programmed prior to upper page 456.

As indicated by "12," the programming operation continues with programming, in parallel, the lower page associated with a WL3 cell coupled to the first even sense line 432-1 (BL0) and the lower page associated with a WL3 cell coupled to the second even sense line 436-1 (BL2). The programming operation continues, e.g., as indicated by "13," with programming, in parallel, the lower page associated with a WL3 cell coupled to the first odd sense line 433-1 (BL1) and the lower page associated with a WL3 cell coupled to the second odd sense line 433-2 (BL3).

The programming operation continues, e.g., as indicated by "14," with programming the upper page 452 of the WL2 cell coupled to the first even sense line 432-1 (BL0). As indicated by "15," the operation continues with programming, in parallel, the upper page 453 of the WL2 cells coupled to the first and second odd sense lines 433-1 (BL1) and 433-2 (BL3). As indicated by "16," the operation continues with programming the upper page 456 of the WL2 cells coupled to the second even sense line 436-1 (BL2). That is, in the embodiment of FIG. 4B, the upper page 452 of the WL2 cell coupled to the first even sense line 432-1 (BL0) and the upper page 456 of the WL2 cell coupled to the second even sense line 436-1 are programmed separately, e.g., upper page 452 is programmed prior to upper page 456.

As indicated by "17," the programming operation continues with programming, in parallel, the lower page associated with a WL4 cell coupled to the first even sense line 432-1 (BL0) and the lower page associated with a WL4 cell coupled to the second even sense line 436-1 (BL2). The programming operation continues, e.g., as indicated by "18," with programming, in parallel, the lower page associated with a WL4 cell coupled to the first odd sense line 433-1 (BL1) and the lower page associated with a WL4 cell coupled to the second odd sense line 433-2 (BL3).

The programming operation continues, e.g., as indicated by "19," with programming the upper page 452 of the WL3 cell coupled to the first even sense line 432-1 (BL0). As indicated by "20," the operation continues with programming, in parallel, the upper page 453 of the WL3 cells coupled to the first and second odd sense lines 433-1 (BL1) and 433-2 (BL3). As indicated by "21," the operation continues with programming the upper page 456 of the WL3 cells coupled to the second even sense line 436-1 (BL2). That is, in the embodiment of FIG. 4B, the upper page 452 of the WL3 cell coupled to the first even sense line 432-1 (BL0) and the upper page 456 of the WL3 cell coupled to the second even sense line 436-1 are programmed separately, e.g., upper page 452 is programmed prior to upper page 456.

As indicated by "22," the programming operation continues with programming, in parallel, the lower page associated with a WL5 cell coupled to the first even sense line 432-1 (BL0) and the lower page associated with a WL5 cell coupled to the second even sense line 436-1 (BL2). The programming operation continues, e.g., as indicated by "23," with programming, in parallel, the lower page associated with a WL5 cell coupled to the first odd sense line 433-1 (BL1) and the lower page associated with a WL5 cell coupled to the second odd sense line 433-2 (BL3).

The programming operation continues, e.g., as indicated by "24," with programming the upper page 452 of the WL4 cell coupled to the first even sense line 432-1 (BL0). As indicated by "25," the operation continues with programming, in parallel, the upper page 453 of the WL4 cells coupled to the first and second odd sense lines 433-1 (BL1) and 433-2 (BL3). As indicated by "26," the operation continues with programming the upper page 456 of the WL4 cells coupled to the second even sense line 436-1 (BL2). That is, in the embodiment of FIG. 4B, the upper page 452 of the WL4 cell coupled to the first even sense line 432-1 (BL0) and the upper page 456 of the WL4 cell coupled to the second even sense line 436-1 are programmed separately, e.g., upper page 452 is programmed prior to upper page 456.

The programming operation embodiment illustrated by the table 400 of FIG. 4B is continued through subsequent select lines, e.g., WL6, WL7, WL8, etc. (not shown). Hence, the programming operation for the embodiment of FIG. 4B can be repeated for the entire memory block being programmed. Floating gate-to-floating gate (FG-FG) interference associated with an array of non-volatile memory cells can be reduced by varying the assigned number of storable bits associated with cells coupled to subsets of sense lines along a given select line and programming the cells in accordance with one or more embodiments of the present disclosure.

Figure 5:
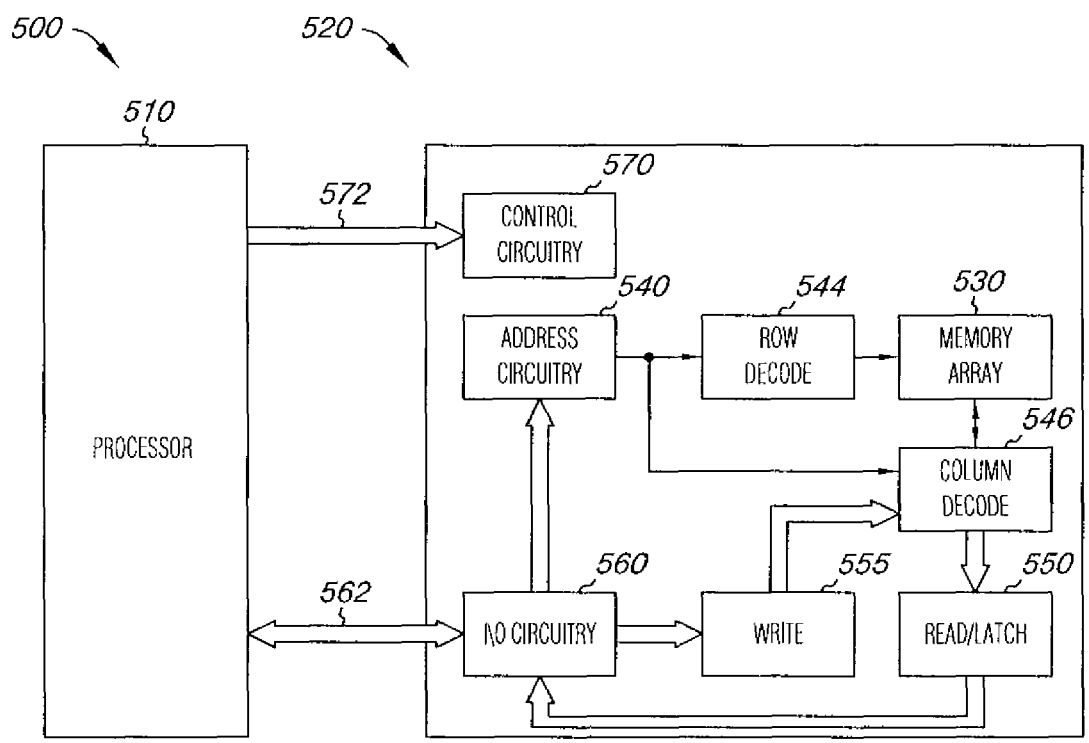
FIG. 5 is a functional block diagram of an electronic memory system having at least one memory device in accordance with an embodiment of the present disclosure.

FIG. 5 is a functional block diagram of an electronic memory system 500 having at least one memory device 520 in accordance with an embodiment of the present disclosure. Memory system 500 includes a processor 510 coupled to a non-volatile memory device 520 that includes a memory array 530 of multilevel non-volatile cells. The memory system 500 can include separate integrated circuits or both the processor 510 and the memory device 520 can be on the same integrated circuit. The processor 510 can be a microprocessor or some other type of controlling circuitry such as an application-specific integrated circuit (ASIC).

For clarity, the electronic memory system 500 has been simplified to focus on features with particular relevance to the present disclosure. The memory device 520 includes an array of non-volatile memory cells 530, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 5 includes address circuitry 540 to latch address signals provided over I/O connections 562 through 110 circuitry 560. Address signals are received and decoded by a row decoder 544 and a column decoder 546 to access the memory array 530. In light of the present disclosure, it will be appreciated by those skilled in the art that the number of address input connections depends on the density and architecture of the memory array 530 and that the number of addresses increases with both increased numbers of memory cells and increased numbers of memory blocks and arrays.

The memory array 530 of non-volatile cells can include non-volatile multilevel memory cells having varying numbers of assigned program states and varying bit assignments according to embodiments described herein. The memory device 520 reads data in the memory array 530 by sensing voltage and/or current changes in the memory array columns using sense/buffer circuitry that in this embodiment can be read/latch circuitry 550. The read/latch circuitry 550 can read and latch a page or row of data from the memory array 530. I/O circuitry 560 is included for bi-directional data communication over the I/O connections 562 with the processor 510. Write circuitry 555 is included to write data to the memory array 530.

Control circuitry 570 decodes signals provided by control connections 572 from the processor 510. These signals can include chip signals, write enable signals, and address latch signals that are used to control the operations on the memory array 530, including data read, data write, and data erase operations. In various embodiments, the control circuitry 570 is responsible for executing instructions from the processor 510 to perform the operating and programming embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

Figure 6:
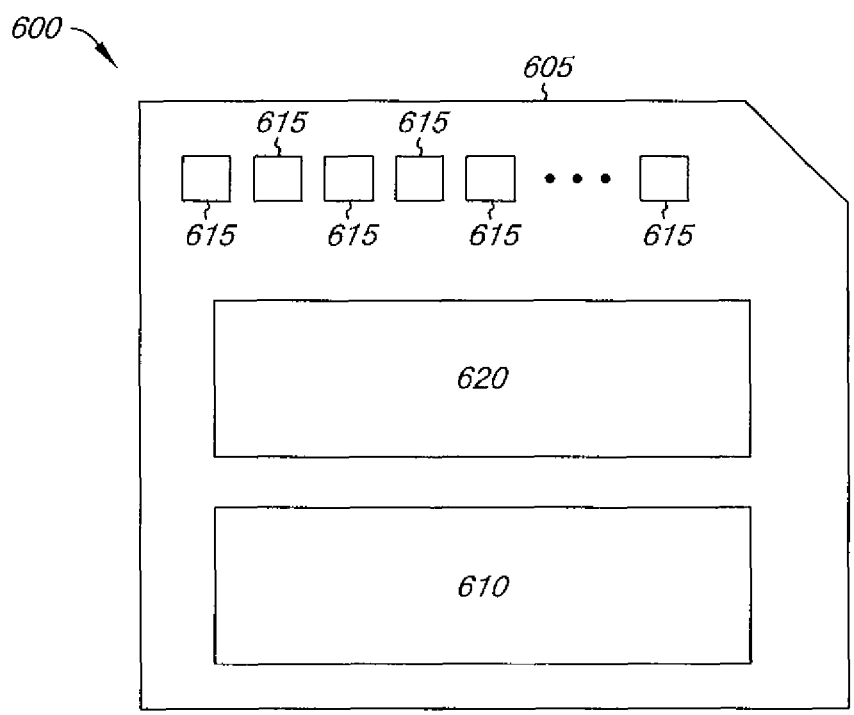
FIG. 6 is a functional block diagram of a memory module having at least one memory device in accordance with an embodiment of the present disclosure.

FIG. 6 is a functional block diagram of a memory module having at least one memory device in accordance with an embodiment of the present disclosure. Memory module 600 is illustrated as a memory card, although the concepts discussed with reference to memory module 600 are applicable to other types of removable or portable memory (e.g., USB flash drives) and are intended to be within the scope of "memory module" as used herein. In addition, although one example form factor is depicted in FIG. 6, these concepts are applicable to other form factors as well.

In some embodiments, memory module 600 will include a housing 605 (as depicted) to enclose one or more memory devices 610, though such a housing is not essential to all devices or device applications. At least one memory device 610 includes an array of non-volatile multilevel memory cells that can be programmed and/or read according to embodiments described herein. Where present, the housing 605 includes one or more contacts 615 for communication with a host device. Examples of host devices include digital cameras, digital recording and playback devices, PDAs, personal computers, memory card readers, interface hubs and the like. For some embodiments, the contacts 615 are in the form of a standardized interface. For example, with a USB flash drive, the contacts 615 might be in the form of a USB Type-A male connector. For some embodiments, the contacts 615 are in the form of a semi-proprietary interface, such as might be found on CompactFlashr™ memory cards licensed by SanDisk Corporation, Memory Stick™ memory cards licensed by Sony Corporation, SD Secure Digital™ memory cards licensed by Toshiba Corporation and the like. In general, however, contacts 615 provide an interface for passing control, address and/or data signals between the memory module 600 and a host having compatible receptors for the contacts 615.

The memory module 600 may optionally include additional circuitry 620, which may be one or more integrated circuits and/or discrete components. For some embodiments, the additional circuitry 620 may include control circuitry, such as a memory controller, for controlling access across multiple memory devices 610 and/or for providing a translation layer between an external host and a memory device 610. For example, there may not be a one-to-one correspondence between the number of contacts 615 and a number of 610 connections to the one or more memory devices 610. Thus, a memory controller could selectively couple an I/O connection (not shown in FIG. 6) of a memory device 610 to receive the appropriate signal at the appropriate I/O connection at the appropriate time or to provide the appropriate signal at the appropriate contact 615 at the appropriate time. Similarly, the communication protocol between a host and the memory module 600 may be different than what is required for access of a memory device 610. A memory controller could then translate the command sequences received from a host into the appropriate command sequences to achieve the desired access to the memory device 610. Such translation may further include changes in signal voltage levels in addition to command sequences.

The additional circuitry 620 may further include functionality unrelated to control of a memory device 610 such as logic functions as might be performed by an ASIC. Also, the additional circuitry 620 may include circuitry to restrict read or write access to the memory module 600, such as password protection, biometrics or the like. The additional circuitry 620 may include circuitry to indicate a status of the memory module 600. For example, the additional circuitry 620 may include functionality to determine whether power is being supplied to the memory module 600 and whether the memory module 600 is currently being accessed, and to display an indication of its status, such as a solid light while powered and a flashing light while being accessed. The additional circuitry 620 may further include passive devices, such as decoupling capacitors to help regulate power requirements within the memory module 600.

CONCLUSION

Methods, devices, modules, and systems for operating non-volatile memory cells have been shown. One method embodiment includes assigning a first number of bits to be stored by a first cell coupled to a first sense line, assigning a second number of bits to be stored by a second cell coupled to a second sense line adjacent to the first sense line, and assigning a third number of bits to be stored by a third cell coupled to a third sense line adjacent to the second sense line. The number of bits assigned to the first cell is less than the number of bits assigned to the second cell and the number of bits assigned to the second cell is less than the number of bits assigned to the third cell. The method includes programming, in parallel, a lower page associated with the first cell and a lower page associated with the third cell, and programming, separately, an upper page associated with the first cell and an upper page associated with the third cell.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating an array of memory cells, the method comprising:
    performing a lower page programming process, in parallel, on a first cell and a second cell;
    performing an upper page programming process, separately, on the first cell and on the second cell; and
    wherein performing the upper page programming process includes:
        programming the first cell to one of a particular number of states; and
        programming the second cell to one of a different particular number of states.

2. The method of claim 1, including:
    programming the first cell to the one of the particular number of states based, at least in part, on a particular state of a first number of states to which the first cell was programmed in the lower page programming process; and
    programming the second cell to the one of the different particular number of states based, at least in part, on a particular state of a second number of states to which the second cell was programmed in the lower page programming process.

3. The method of claim 2, wherein the first number of states is the same as the second number of states.

4. The method of claim 2, wherein the particular number of states to which the first cell is programmed during the upper page programming process is different than the first number of states and the second number of states, and wherein the different particular number of states to which the second cell is programmed during the upper page programming process is different than the first number of states and the second number of states.

5. The method of claim 2, wherein the method includes performing a lower page programming process on a third cell prior to performing the upper page programming process on the first cell and the second cell, and wherein the third cell is adjacent to and between both the first cell and the second cell.

6. The method of claim 5, wherein the method includes performing an upper page programming process on the third cell, the upper page programming process including programming the third cell to one of a particular number of states based, at least in part, on a third number of states to which the third cell was programmed in the lower page programming process, and wherein the third number of states is the same as the first number of states and the second number of states.

7. The method of claim 6, including performing the lower page programming process on the third cell prior to performing the upper page programming process on the first cell and the second cell.

8. The method of claim 7, wherein a number of states to which the third cell is programmed in the upper page programming process is greater than the different particular number of states to which the second cell is programmed during the upper page programming process.

9. The method of claim 5, including performing an upper page programming process on the third cell in parallel with performing an upper page programming process on a fourth cell, wherein the fourth cell is adjacent to the second cell.

10. A method for operating an array of memory cells, the method comprising:
programming a first cell to one of a first number of states and a second cell to one of a second number of states;
programming the first cell to one of a third number of states based, at least in part, on the one of the first number of states; and
programming the second cell to one of a fourth number of states based, at least in part, on the one of the second number of states, wherein third number of states is different than the second number of states.

11. The method of claim 10, wherein the first number of states is the same as the second number of states.

12. The method of claim 10, including programming, in parallel, the first cell to the one of the first number of states and the second cell to the one of the second number of states.

13. The method of claim 10, including programming, in parallel, the first cell to the one of the first number of states and the second cell to the one of the second number of states, and wherein the first number of states is the same as the second number of states.

14. The method of claim 10, including programming a third cell to one of a fifth number of states before programming the first cell to the one of the third number of states and before programming the second cell to the one of the fourth number of states, and wherein the third cell is adjacent to and between both the first cell and the second cell.

15. The method of claim 14, wherein the method includes programming the third cell to one of a sixth number of states based, at least in part, on the one of the fifth number of states before programming the second cell to one of the fourth number of states and after programming the first cell to the one of the third number of states.

16. The method of claim 15, wherein the sixth number of states is greater than the third number of states and is less than the fourth number of states.

17. The method of claim 15, wherein the method includes programming, in parallel with programming the third cell to the one of the sixth number of states, a fourth cell to a one of the sixth number of states, and wherein the fourth cell is adjacent to the second cell.

18. A method for operating an array of memory cells, the method comprising:
performing a lower page programming process, in parallel, on a first cell and a second cell; and
performing, at separate times, an upper page programming process on the first cell and on the second cell; wherein performing the upper page programming process includes:
programming the first cell to one of a particular number of states such that it represents a first non-integer number of digits; and
programming the second cell to one of a different particular number of states such that it represents a second non-integer number of digits, the second non-integer number of digits is different than the first non-integer number of digits.

19. A memory device comprising:
an array of memory cells; and
control circuitry coupled to the array and configured to:
perform a lower page programming process on a first cell coupled to a first sense line, the first cell having a first number of storable digits;
perform a lower page programming process on a second cell coupled to a second sense line adjacent the first sense line, the second cell having a second number of storable digits that is greater than the first number of storable digits;
perform a lower page programming process on a third cell coupled to a third sense line adjacent the second sense line, the third cell having a third number of storable digits that is greater than the second number of storable digits, wherein the lower page programming process is performed in parallel on the first cell and the third cell; and
perform an upper page programming process, separately, on the first cell and on the third cell; wherein performing the upper page programming process includes:
programming the first cell to one of a particular number of states; and
programming the third cell to one of a different particular number of states.

20. The device of claim 19, wherein the control circuitry is configured to:
program the first cell to the one of the particular number of states based, at least in part, on a particular state of a first number of states to which the first cell was programmed in the lower page programming process; and
program the third cell to the one of the different particular number of states based, at least in part, on a particular state of a second number of states to which the third cell was programmed in the lower page programming process.

21. The device of claim 20, wherein the control circuitry is configured to:
perform the lower page programming process on the first cell and on the third cell prior to performing the lower page programming process on the second cell; and
perform an upper page programming process on the second cell including programming the second cell to one of a particular number of states based, at least in part, on a third number of states to which the second cell was programmed in the lower page programming process;
wherein the upper page process is performed on the second cell subsequent to performing the upper page programming process on the first cell and prior to performing the upper page programming process on the third cell; and
wherein the third number of states is the same as the first number of states and the second number of states.

22. The device of claim 21, wherein the first number of storable digits and the third number of storable digits are each a non-integer number of storable digits.

23. The device of claim 22, wherein the first non-integer number of storable digits is less than the third non-integer number of storable digits.

24. A memory device comprising:
an array of memory cells; and
control circuitry coupled to the array and configured to:
program a first cell coupled to a first sense line to one of a first number of states;

program a second cell coupled to a second sense line adjacent the first sense line to one of the first number of states;

program, in parallel with programming the first cell to the one of the first number of states, a third cell coupled to a third sense line adjacent the second sense line to one of the first number of states; and program, at separate times:
the first cell from the respective one of the first number of states to one of a second number of states; and
the third cell from the respective one of first number of states to one of a third number of states, the third number of states is greater than the second number of states.

25. The device of claim 24, wherein the control circuitry is configured to:
program, in parallel with programming the second cell to the one of the first number of states, a fourth cell coupled to a fourth sense line adjacent the third sense line to one of the first number of states; and
program, in parallel:
the second cell from the respective one of the first number of states to one of a fourth number of states; and
the fourth cell from the respective one of the first number of states to one of the fourth number of states, wherein the fourth number of states is less than the third number of states and greater than the second number of states.

* * * * *